United States Patent
De Cock

(10) Patent No.: US 8,736,298 B2
(45) Date of Patent: May 27, 2014

(54) METHOD FOR DETECTING A STEP LOSS CONDITION

(75) Inventor: Bart De Cock, Wespelaar (BE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 432 days.

(21) Appl. No.: 13/282,425

(22) Filed: Oct. 26, 2011

(65) Prior Publication Data
US 2013/0106460 A1   May 2, 2013

(51) Int. Cl.
*G01R 31/34* (2006.01)

(52) U.S. Cl.
USPC .................................................. 324/765.01

(58) Field of Classification Search
CPC .............. G01R 31/343; G01R 33/288; G01R 33/3815; G01R 33/389; G01R 33/421; H02P 8/38
See application file for complete search history.

(56) References Cited

U.S. PATENT DOCUMENTS

| | | | |
|---|---|---|---|
| 4,002,058 A * | 1/1977 | Wolfinger | 73/662 |
| 4,422,040 A | 12/1983 | Raider et al. | |
| 6,856,137 B2 * | 2/2005 | Roden et al. | 324/509 |
| 7,288,956 B2 | 10/2007 | De Cock et al. | |
| 8,072,177 B2 | 12/2011 | Arisawa | |
| 2002/0171388 A1 | 11/2002 | Seki | |

FOREIGN PATENT DOCUMENTS

EP   1968183 A1   10/2008

OTHER PUBLICATIONS

Semiconductor Components Industries, LLC (SCILLC), Jan. 2009-Rev. 6.1; AMIS-30623 Micro-stepping Motor Driver; Publication Order Number: 30623/A; http://onsemi.com.
Semiconductor Components Industries, LLC (SCILLC), Jan. 2009; AMIS-30521/NCV70521 Micro-stepping Motor Driver; http://onsemi.com.

* cited by examiner

*Primary Examiner* — Tung X Nguyen
(74) *Attorney, Agent, or Firm* — Rennie William Dover

(57) ABSTRACT

A method for detecting and correcting for a step loss condition. A back electromagnetic force signal is measured and compared to a reference voltage. The motor continues operating and the back electromagnetic force signal is measured again and compared to the reference voltage. If the measured levels of the back emf voltages are less than the reference voltage, a step loss condition has occurred and the stator field is repositioned.

10 Claims, 4 Drawing Sheets

METHOD FOR DETECTING A STEP LOSS CONDITION

The present application is based on prior U.S. patent application Ser. No. 12/415,009 filed on Mar. 31, 2009, which is hereby incorporated herein by reference in its entirety, and priority thereto for common subject matter is hereby claimed.

TECHNICAL FIELD

The present invention relates, in general, to motors and, more particularly, to step loss detection in a motor.

BACKGROUND

Multiple phase motors are used in a variety of applications including disc drives, compact disc players, digital video disc players, scanners, printers, plotters, actuators used in the automotive and aviation industries, etc. Typically, multiple phase motors include a stationary portion or stator that produces a rotating magnetic field and a non-stationary portion or rotor in which torque is created by the rotating magnetic field. The torque causes the rotor to rotate which in turn causes a shaft connected to the rotor to rotate. In stepper motors, the shaft is rotated in steps or increments depending on the desired position of the output shaft. Although stators and rotors are commonly used to generate torque, a step loss condition may occur that decreases the accuracy of a motor. When a step loss condition occurs, the rotor stops or substantially stops rotating, which causes additional noise and extra wear on the mechanical components attached to the rotor. In addition, the lost steps may not be noticed which can create poor positioning accuracy.

Accordingly, it would be advantageous to have a method for detecting and correcting for a step loss condition. It would be of further advantage for the method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

DETAILED DESCRIPTION

Generally the present invention provides methods for detecting and correcting a fault condition such as, for example, a step loss condition in a motor. In accordance with embodiments of the present invention, the level of the back electromagnetic force is measured and compared to a reference voltage. If the back emf voltage level is less than the reference voltage level for at least two consecutive measurements, a fault condition such as, for example, a step loss condition has occurred. In response to the step loss condition, the stator field is re-positioned.

In accordance with other embodiments, a method for detecting a fault condition in a motor, comprises providing a time-varying parameter of an energy storage device and comparing an electromagnetic force signal with a first reference signal at a first time when the time-varying parameter is at a predetermined level. Then the electromagnetic force signal is compared with one of the first reference signal or a second reference signal at a second time when the time-varying parameter is at the predetermined level. A fault condition has occurred if the electromagnetic force signal at the first time is less than the first reference signal and the electromagnetic force signal at the second time is less than the second reference signal or if the electromagnetic force signal at the first time is greater than the first reference signal and the electromagnetic force signal at the second time is greater than the second reference signal.

Figure 1:
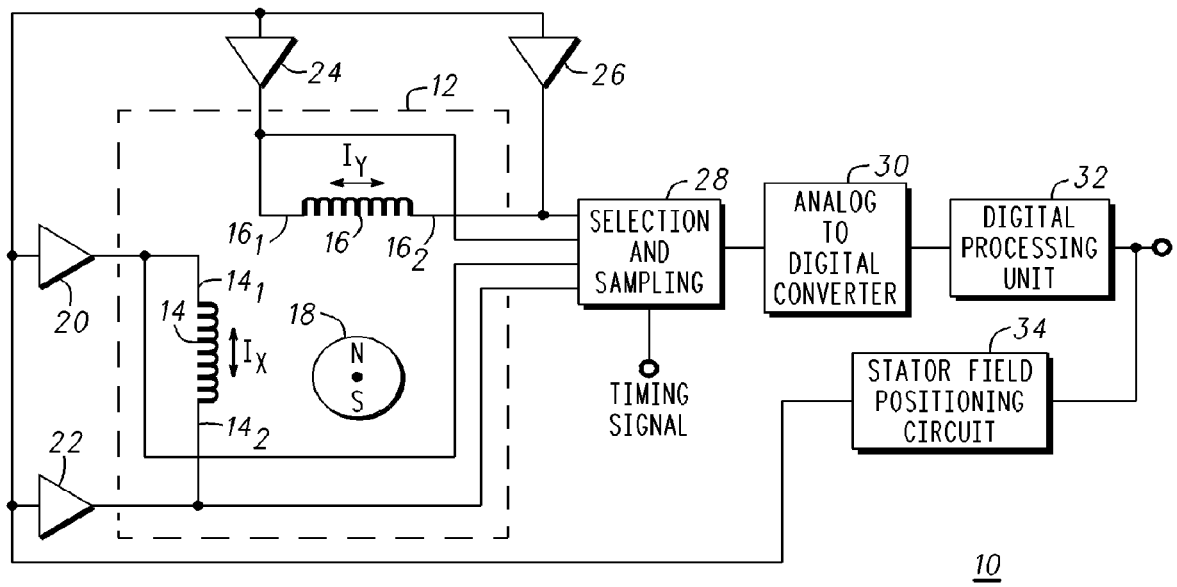
FIG. 1 is a schematic representation of a portion of a motor with bipolar drive in which a step loss condition can be determined in accordance with an embodiment of the present invention.

FIG. 1 is a schematic representation 10 of a portion of a two-phase stepper motor 12 with bipolar drive in which a step loss condition can be determined in accordance with an embodiment of the present invention. The portion of two-phase stepper motor 12 shown in FIG. 1 includes a coil 14 having terminals $14_1$ and $14_2$ and a coil 16 having terminals $16_1$ and $16_2$ that are electromagnetically coupled to a rotor 18. Driver circuits 20 and 22 are connected to terminals $14_1$ and $14_2$ of coil 14, respectively, and driver circuits 24 and 26 are connected to terminals $16_1$ and $16_2$ of coil 16, respectively. Driver circuits 20 and 22 operate in a push-pull fashion where driver circuit 22 sinks a current $I_X$ from coil 14 when driver circuit 20 sources current $I_X$ to coil 14 and driver circuit 20 sinks a current $I_X$ from coil 14 when driver circuit 22 sources current $I_X$ to coil 14. Similarly, driver circuits 24 and 26 operate in a push-pull fashion where driver circuit 26 sinks a current $I_Y$ from coil 16 when driver circuit 24 sources current $I_Y$ to coil 16 and driver circuit 24 sinks current $I_Y$ from coil 16 when driver circuit 26 sources current $I_Y$ to coil 16. Thus, driver circuits 20, 22, 24, and 26 are referred to as push-pull drivers or current sink/current source drivers. A selection and sampling circuit 28 has inputs connected to terminals $14_1$, $14_2$, $16_1$, and $16_2$ of corresponding coils 14 and 16, an input coupled for receiving a timing signal, and an output coupled to an input of an analog-to-digital converter (ADC) 30. A digital processing unit 32 is connected to ADC 30 and outputs a rotor signal that indicates rotor information such as detection of a step loss condition or a stall condition, rotor speed, rotor acceleration, direction of rotor movement, or the like. A stator field positioning circuit 34 has an input connected to the output of digital processing unit 32 and an output connected to the inputs of driver circuits 20, 22, 24, and 26 for repositioning the stator field in the event that a low back EMF condition occurs indicating the loss of a step in a stepper motor.

Figure 2:
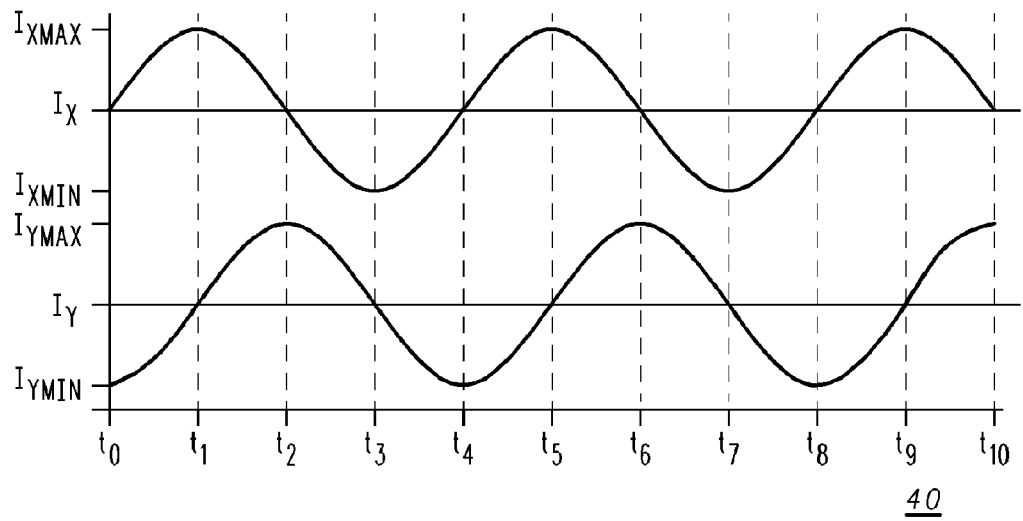
FIG. 2 is a timing diagram illustrating the timing relationship between coil currents in accordance with embodiments of the present invention.

FIG. 2 is a timing diagram 40 illustrating the timing relationship between currents $I_X$ and $I_Y$ in accordance with embodiments of the present invention. Preferably, currents $I_X$ and $I_Y$ have sinusoidal waveforms, where current $I_X$ has a maximum amplitude or current level $I_{XMAX}$ and a minimum amplitude or current level $I_{XMIN}$ and current $I_Y$ has a maximum amplitude or current level $I_{YMAX}$ and a minimum amplitude or current level $I_{YMIN}$. By way of example, currents $I_X$ and $I_Y$ are shifted over 90 degrees with respect to each other. Thus, when current $I_X$ reaches maximum amplitude $I_{XMAX}$, or minimum amplitude $I_{XMIN}$, current $I_Y$ equals zero and when current $I_Y$ reaches maximum amplitude $I_{YMAX}$ or minimum amplitude $I_{YMIN}$, current $I_X$ equals zero. In other words, when current $I_Y$ equals zero, current $I_X$ is at a maximum, i.e., $I_{XMAX}$ or a minimum, i.e., $I_{XMIN}$ and when current $I_X$ equals zero, current $I_Y$ is at a maximum, i.e., $I_{YMAX}$ or a minimum, i.e., $I_{YMIN}$. For the example illustrated in FIG. 2, current $I_X$ is at maximum current level $I_{XMAX}$ at times $t_1$, $t_5$, and $t_9$ and minimum amplitude or current level $I_{XMIN}$ at times $t_3$ and $t_7$, and current $I_Y$ is at maximum current level $I_{YMAX}$ at times $t_2$, $t_6$, and $t_{10}$ and minimum current level $I_{YMIN}$ at times $t_0$, $t_4$, and $t_8$. At times $t_0$, $t_2$, $t_4$, $t_6$, $t_8$, and $t_{10}$, current $I_X$ has a value substantially equal to zero and at times $t_1$, $t_3$, $t_5$, $t_7$, and $t_9$, current $I_Y$ has a value substantially equal to zero. For current $I_X$, times $t_0$, $t_2$, $t_4$, $T_6$, $t_8$, and $t_{10}$ are referred to as zero crossing points or zero crossing times, whereas for current $I_Y$ times $t_1$, $t_3$, $t_5$, $t_7$, and $t_9$ are referred to as zero crossing points or zero crossing times.

Figure 3:
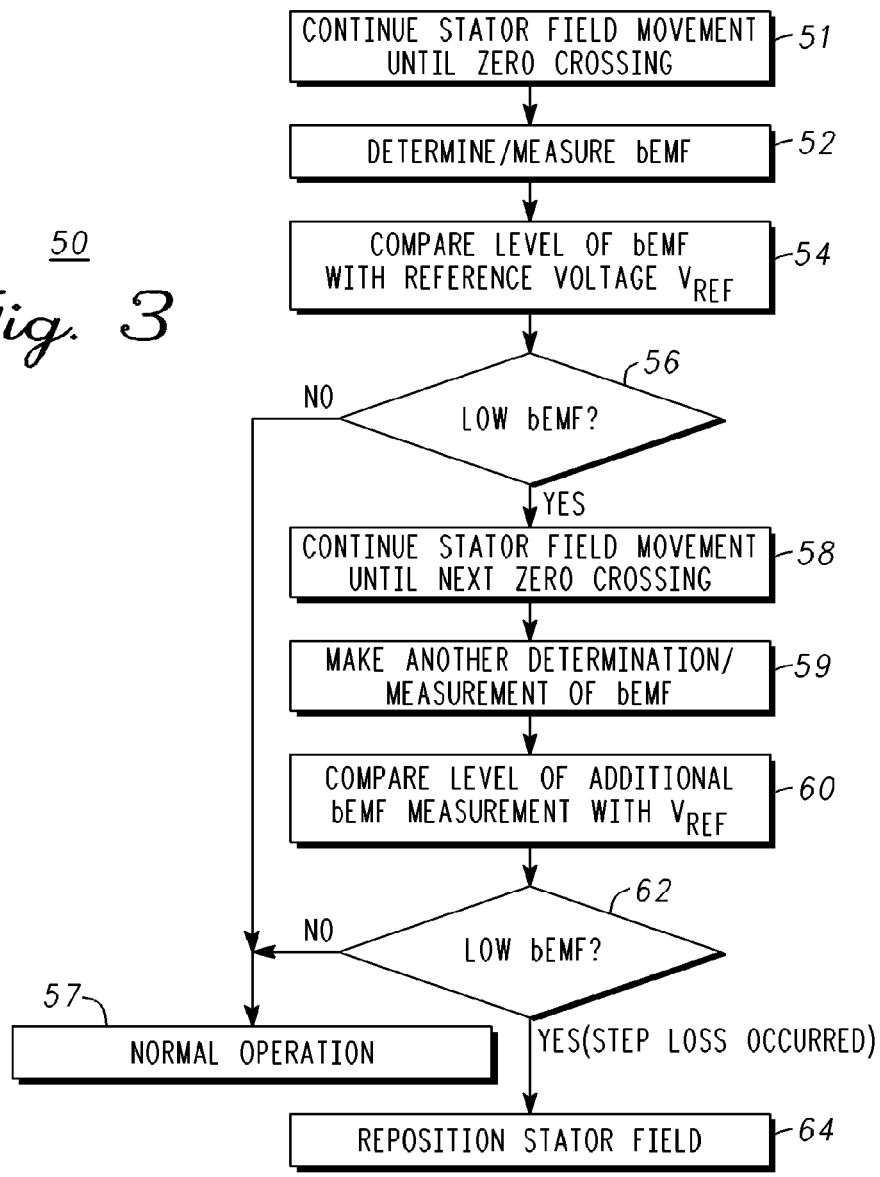
FIG. 3 is a flow diagram illustrating a method for detecting a step loss condition in a motor in accordance with an embodiment of the present invention.

FIG. 3 is a flow diagram 50 illustrating a method for detecting a fault condition such as, for example, a step loss condition in a motor in accordance with an embodiment of the present invention. During operation, rotor 18 rotates and has a field that changes with changes in shaft angle. The result of this is that turning rotor 18 induces an AC voltage in each coil 14 and 16. This induced voltage is referred to as back electromagnetic force (back EMF or bEMF) or counter electromagnetic force (cEMF). According to an aspect of the present invention, it is this back EMF which is measured in order to determine whether or not rotor 18 is in a step loss condition.

When a time-varying parameter such as a current $I_X$ flowing through coil 14 is for example at current level $I_{XMAX}$, coil 16 is not energized and a time-varying parameter such as current $I_Y$ is zero. In response to current $I_X$ flowing through coil 14, rotor 18 turns so as to align with the magnetic field created by current $I_X$. Rotor 18 is thus a turning or rotating magnet which generates a moving magnetic field. Hence, there are two synchronous fields inside the motor, i.e. the stator field induced by the coil current and the rotor field, which is the magnetic field around the rotating rotor 18. The difference in alignment between these two fields or between the rotor flux and the stator flux is called the load angle.

Coil 16 picks up the moving magnetic field of rotor 18, but because it is not energized, neither driver circuit 24 nor driver circuit 26 transmit current through coil 16. Thus, stator field movement continues until a zero crossing occurs (indicated by box 51). A back EMF voltage signal is detectable across terminals $16_1$ and $16_2$ of coil 16. Measurement of the back EMF voltage signals preferably occurs at the zero crossing times of drive currents $I_X$ and $I_Y$ that are flowing through coils 14 and 16, respectively, i.e., when the coils are not energized. Accordingly, the back EMF voltage signal is determined or measured when the current through one of the coils is at a zero crossing (indicated by box 52). For the example of two-phase bipolar stepper motor 12, back EMF signals can be detected from coil 14 at the times when drive current $I_X$ is zero and drive current $I_Y$ is at current level $I_{YMAX}$, i.e., at times $t_2$, $t_6$, and $t_{10}$ or drive current $I_Y$ is at current level $I_{YMIN}$, i.e., at times $t_0$, $t_4$, and $t_8$, and from coil 16 at the times when drive current $I_Y$ is zero and drive current $I_X$ is at current level $I_{XMAX}$, i.e., at times $t_1$, $t_5$, and $t_9$ or current $I_X$ is at current level $I_{XMIN}$, i.e., times $t_3$ and $t_7$. Alternatively, the back EMF voltage may be derived from an arithmetic parameter such as an average of a plurality of back EMF samples, a mean of a plurality of back EMF samples, an integral of a plurality of back EMF samples, a minimum of a plurality of back EMF samples, a maximum of a plurality of back EMF samples, one or more filtered back EMF signals, an amplitude of a plurality of back EMF samples, etc.

It should be noted that in case stepper motor 12 is operated in a micro-stepping mode or at higher speeds in half-step or full-step mode, rotor-acceleration changes are relatively small because there is a continuous movement of rotor 18. It should be further noted that the generated back EMF signal is sensed across the non-active coil.

After measuring the back EMF voltage signal, it is compared to a reference voltage $V_{REF}$ (indicated by box 54) to generate a comparison signal and to determine whether a fault condition such as, for example, a step loss condition may have occurred. Reference voltage $V_{REF}$ may also be referred to as a threshold voltage $V_{THR}$ and may be a measurement of, among other things, the motor speed or load angle. Like the back EMF, reference voltage $V_{REF}$ may be derived from an arithmetic parameter such as an average of a plurality of back EMF samples, a mean of a plurality of back EMF samples, an integral of a plurality of back EMF samples, a minimum of a plurality of back EMF samples, a maximum of a plurality of back EMF samples, one or more filtered back EMF signals, an amplitude of a plurality of back EMF samples, etc. In addition, it should be noted that the threshold reference values and ranges can change values over time. For example, they may change depending on the outcome of a previous comparison or due to a change in a parameter such as temperature, etc. If the back EMF voltage is greater than reference voltage $V_{REF}$, a step loss condition has not occurred and stepper motor 12 continues normal operation (indicated by decision diamond 56 and box 57 in FIG. 3).

If the back EMF voltage is less than reference voltage $V_{REF}$, a step loss condition may have occurred (indicated by decision diamond 56 of FIG. 3). The stator field movement continues until the next zero crossing occurs (indicated by box 58). At a zero crossing, the back EMF voltage signal is measured again, as described above, and compared to reference voltage $V_{REF}$ (indicated by boxes 59 and 60) to generate another comparison signal and to determine whether a fault condition such as, for example, a step loss condition has occurred. As described above, if the back EMF voltage is greater than reference voltage $V_{REF}$, a step loss condition has not occurred (indicated by decision diamond 62) and stepper motor 12 continues normal operation (indicated by box 57 of FIG. 3). However, if the back EMF voltage is less than reference voltage $V_{REF}$ for a second time (indicated by decision diamond 62), a step loss condition has occurred and the stator field is repositioned (indicated by box 64 of FIG. 3). In accordance with an alternative embodiment, the comparison of the back EMF shown in decision diamond 62 is made with a reference voltage having a different voltage than reference voltage $V_{REF}$ used in the comparison at decision diamond 56. In other words, in the comparison identified by decision diamond 56 the back EMF is compared with reference voltage $V_{REF}$ whereas in the comparison identified by decision diamond 62 the back EMF is compared with a voltage that may be lower or higher than reference voltage $V_{REF}$.

Figure 4:
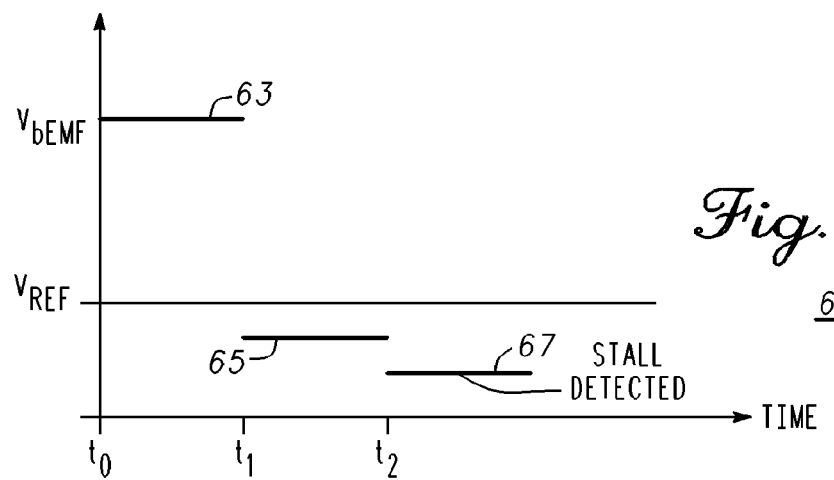
FIG. 4 is a plot of back EMF voltage signal levels versus time in accordance with embodiments of the present invention.

Briefly referring to FIG. 4, a plot 61 of back EMF voltage signals versus time is illustrated. At time $t_0$, the back EMF voltage signal 63 is measured and has a value greater than reference voltage $V_{REF}$. At time $t_1$, the back EMF voltage signal 65 is measured and has a value less than reference voltage $V_{REF}$ and at time $t_2$ the back EMF voltage signal 67 is measured and has a value less than reference voltage $V_{REF}$. The values of the back EMF voltage signals measured at times $t_0$, $t_1$, and $t_2$ are illustrated by traces 63, 65, and 67, respectively. Because the back EMF voltage signals measured beginning at times $t_1$ and $t_2$ are less than reference voltage $V_{REF}$, a step loss condition has occurred.

Figure 5:
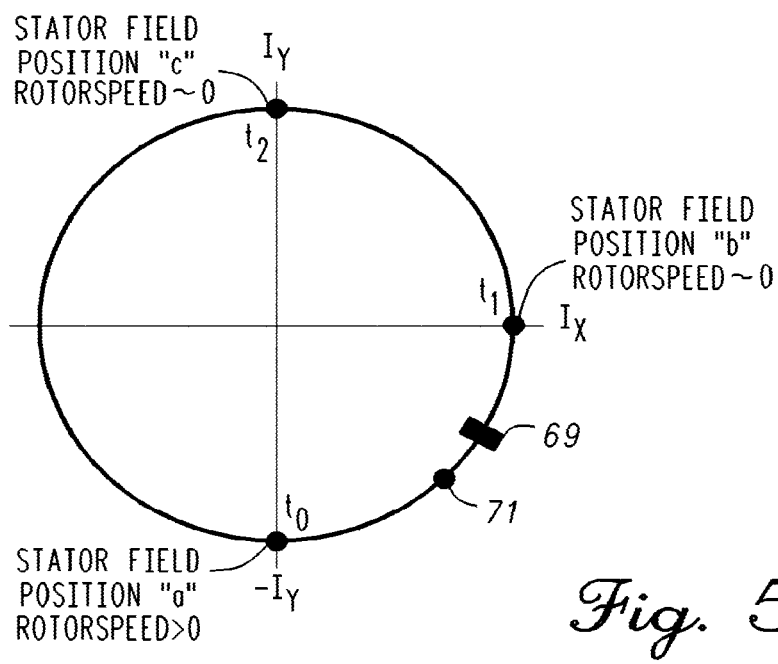
FIG. 5 is a plot representing the stator field electrical position.

Briefly referring to FIG. 5, a plot of current $I_X$ versus current $I_Y$ that represents the stator field electrical position is shown. At time $t_0$, drive current $I_X$ flowing through coil 14 is zero, thus coil 14 is not energized, and drive current $I_Y$ flowing through coil 16 is maximal negative, i.e., at current level $I_{YMIN}$ (i.e., $-I_Y$). At time $t_0$, the back EMF voltage across coil 14 is measured. At time $t_1$, drive current $I_X$ flowing through coil 14 is maximal positive, and drive current $I_Y$ flowing through coil 16 is zero, thus coil 16 is not energized. At time $t_1$, the back EMF voltage across coil 16 is measured. At time $t_2$, drive current $I_Y$ flowing through coil 16 is maximal positive, and the drive current $I_X$ flowing through coil 14 is zero, thus coil 14 is not energized. At time $t_2$, the back EMF voltage across coil 14 is measured. At a position indicated by reference character 69 a stall occurs at which the rotor cannot follow the stator field. As drive currents $I_X$ and $I_Y$ are applied by the user, their phases are known, and thus the times at which any of the coils 14 and 16 is not energized, that is, when drive current signals $I_X$ and $I_Y$ equal zero, are known.

In addition, the relative positions of the stator field and the speed of the rotor are represented around the circumference of the plot. For example, at time $t_0$, current $I_Y$ is at a maximal negative value, current $I_X$ is at about zero, the stator field is at a position "a," the back EMF voltage level is identified by trace 63 in FIG. 4, and the speed of the rotor is greater than zero revolutions per minute. At time $t_1$, current $I_X$ is at a maximal positive value, current $I_Y$ is at about zero, the stator field is at a position "b," the back EMF voltage level is identified by trace 65 in FIG. 4, and the speed of the rotor is about zero revolutions per minute. At time $t_2$, current $I_Y$ is at a maximal positive value, current $I_X$ is at about zero, the stator field is at a position "c," the back EMF voltage level is identified by trace 67 in FIG. 4, and the speed of the rotor is about zero revolutions per minute.

Referring to FIGS. 3 and 5, after detecting or measuring two successive back EMF signal levels that are less than reference voltage $V_{REF}$, a step loss condition exists and a repositioning signal is transmitted from stator field positioning circuit 34 to push-pull driver circuits 20, 22, 24, and 26 (shown in FIG. 1) to reposition the stator field (indicated by box 64 in FIG. 3). For example, stator field positioning circuit 34 may move or reposition the stator field in a clockwise direction by 135 degrees if the stator field was originally in a counterclockwise direction. Moving the stator field in a clockwise direction is also referred to as moving the stator field backwards. Alternatively, stator field positioning circuit 34 may move or reposition the stator field in a counterclockwise direction by about 135 degrees if the stator field was originally in a clockwise direction. It should be noted that the amount of stator field movement is not a limitation of the present invention, i.e., movement of the stator field may be less than 135 degrees or more than 135 degrees. Thus, the stator field is repositioned to be aligned with the rotor field. Briefly referring to FIG. 5, movement of the stator field is illustrated where the stator field has been moved from the position at time $t_2$ to the position indicated by reference character 71, i.e., the stator field has been moved by about 135 degrees. Although it is desirable to move the stator field to a position that is in the middle portion of a quadrant, this is not a limitation of the present invention.

Figure 6:
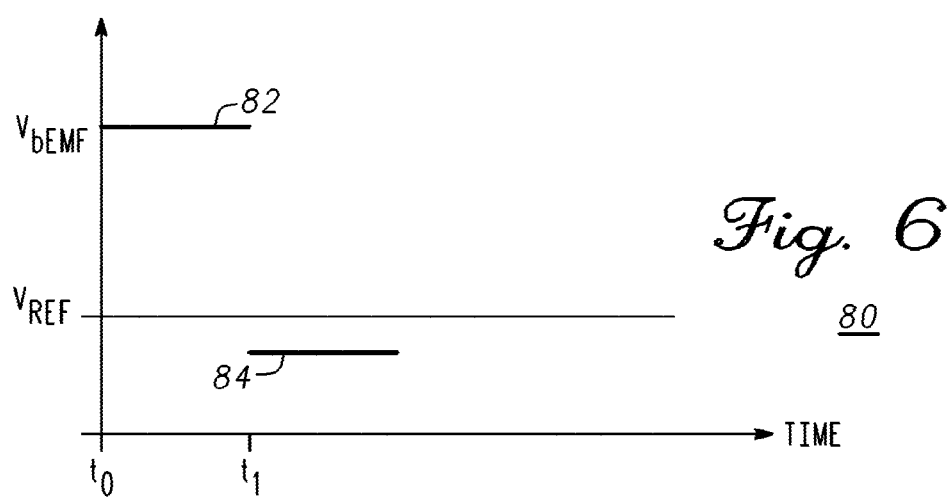
FIG. 6 is a plot of back EMF voltage signal levels versus time in accordance with embodiments of the present invention.

FIG. 6 is a plot 80 of back EMF voltage signals versus time. At time $t_0$, a back EMF voltage signal is measured and has a value greater than reference voltage $V_{REF}$ (indicated by reference character 82). At time $t_1$ the back EMF voltage signal is measured and has a value less than reference voltage $V_{REF}$ (indicated by reference character 84). However, at time $t_1$ rotor 18 may have stopped at the desired position but one in which current $I_Y$ is zero. Thus, it is unclear whether a step loss condition has occurred or whether rotor 18 has stopped at the desired position.

Figure 7:
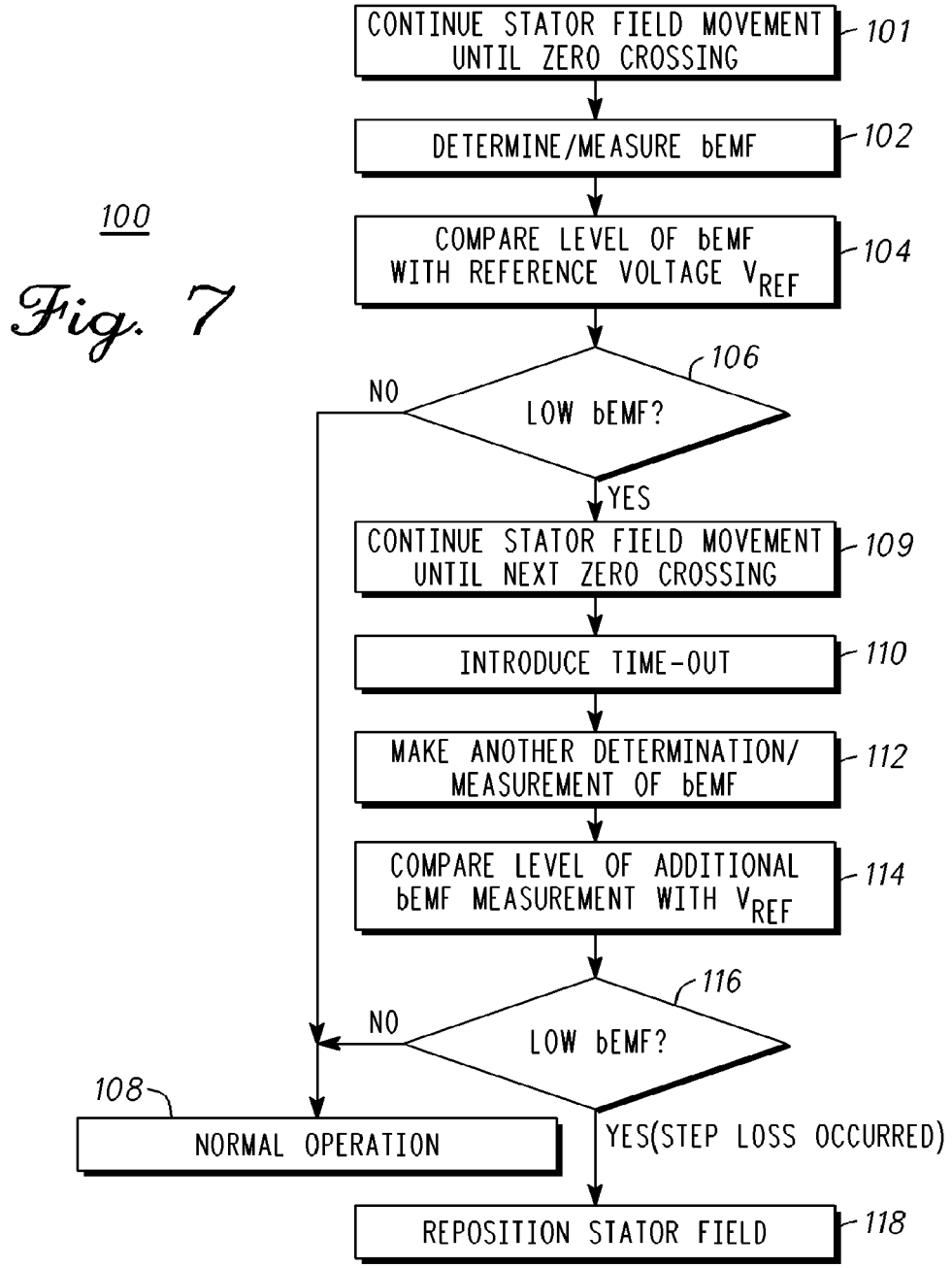
FIG. 7 is a flow diagram illustrating a method for detecting a step loss condition in a motor in accordance with another embodiment of the present invention.

FIG. 7 is a flow diagram 100 illustrating a method for detecting a fault condition such as, for example, a step loss condition in a motor in accordance with another embodiment of the present invention. Referring to FIGS. 6 and 7, at time $t_1$ rotor 18 has stopped moving at a stator field position in which current $I_Y$ is zero. In this example, current $I_X$ flowing through coil 14 is, for example, at current level $I_{XMAX}$, coil 16 is not energized and current is zero. In response to current $I_X$ flowing through coil 14, rotor 18 turns so as to align with the magnetic field created by current $I_X$. Coil 16 picks up the moving magnetic field of rotor 18, but because it is not energized, neither driver circuit 24 nor driver circuit 26 transmit current through coil 16. Thus, stator field movement continues until a zero crossing occurs (indicated by box 101). A back EMF voltage signal is detectable across terminals 16₁ and 16₂ of coil 16. Accordingly, the back EMF voltage signal is determined or measured when the current through one of the coils is at a zero crossing (indicated by box 102). The back EMF sample may be derived from an arithmetic parameter such as an average of a plurality of back EMF samples, a mean of a plurality of back EMF samples, an integral of a plurality of back EMF samples, a minimum of a plurality of back EMF samples, a maximum of a plurality of back EMF samples, one or more filtered back EMF signals, an amplitude of a plurality of back EMF samples, etc. The back EMF sample values and ranges can change value over time. For example, they may change depending on the outcome of a previous comparison or due to a change in a parameter such as temperature, humidity, age, etc.

After measuring the back EMF voltage signal, it is compared to a reference voltage $V_{REF}$ (indicated by box 104) to generate a comparison signal and to determine whether a fault condition such as, for example, a step loss condition has occurred. Reference voltage $V_{REF}$ may also be referred to as a threshold voltage $V_{THR}$ and may be a measurement of, among other things, the motor speed or load angle. As discussed above, reference voltage $V_{REF}$ may be derived from an arithmetic parameter such as an average of a plurality of back EMF samples, a mean of a plurality of back EMF samples, an integral of a plurality of back EMF samples, a minimum of a plurality of back EMF samples, a maximum of a plurality of back EMF samples, one or more filtered back EMF signals, an amplitude of a plurality of back EMF samples, etc. The threshold reference values and ranges can change value over time. For example, they may change depending on the outcome of a previous comparison or due to a change in a parameter such as temperature, humidity, age, etc. If the back EMF voltage is greater than reference voltage $V_{REF}$, a step loss condition has not occurred and stepper motor 12 continues normal operation (indicated by decision diamond 106 and box 108 in FIG. 7).

If the back EMF voltage is less than reference voltage $V_{REF}$, a fault condition such as, for example, a step loss condition may have occurred. The decision as to whether the fault condition may have occurred is indicated by decision diamond 106 in FIG. 7. The stator field movement continues until the next zero crossing occurs (indicated by box 109). A time out circuit included in digital processing unit 32 begins a countdown period (indicated by box 110) after which the back EMF voltage signal is measured again (indicated by box 112), as described above, and compared to reference voltage $V_{REF}$ (indicated by box 114) to generate a comparison signal and to determine whether the fault condition has occurred. As described above, if the back EMF voltage is greater than reference voltage $V_{REF}$, a step loss condition has not occurred (indicated by decision diamond 116) and stepper motor 12 continues normal operation (indicated by decision diamond 116 and box 108 of FIG. 7). However, if the back EMF voltage is less than reference voltage $V_{REF}$ for a second time (indicated by decision diamond 116), the fault condition has occurred and the stator field is repositioned (indicated by box 118 of FIG. 7). In accordance with an alternative embodiment, the comparison of the back EMF shown in decision diamond 104 is made with a reference voltage that is different from reference voltage $V_{REF}$ used in the comparison at decision diamond 116. In other words, in the comparison identified by decision diamond 116 the back EMF is compared with reference voltage $V_{REF}$ whereas in the comparison identified by decision diamond 106 the back EMF is compared with a voltage that may be lower or higher than reference voltage $V_{REF}$.

By now it should be appreciated that methods for detecting whether a step loss condition has occurred and compensating for a stall occurrence have been provided. The back EMF is measured during coil current zero crossings and if the back EMF for two successive coil zero crossings is below a reference voltage, a fault condition such as, for example, a step loss condition is considered to have occurred. It should be understood that the result of two successive comparisons is not limited to being less than the reference voltage. Alternatively, a step loss condition can be indicated if the result of the two successive comparisons is greater than the reference voltage. For example, a reference signal derived from an acceleration signal or a reference signal that is inside or outside of a range of values can be used. In this case the two successive comparisons being greater than the reference signal indicate a step loss condition. In response to the step loss condition, the stator field is repositioned to be aligned with the rotor field. Repositioning the stator field can be accomplished during acceleration or deceleration, thereby decreasing the probability of undetected lost steps in, for example, a stepper motor. In addition, the repositioning can be in the direction of the stator field motion or in the opposite direction from the stator field motion.

Although specific embodiments have been disclosed herein, it is not intended that the invention be limited to the disclosed embodiments. Those skilled in the art will recognize that modifications and variations can be made without departing from the spirit of the invention. For example, the method described with reference to FIGS. 6 and 7 is suitable for determining a step loss condition when the rotor is operating at low speeds, i.e., at sub-resonance. It is intended that the invention encompass all such modifications and variations as fall within the scope of the appended claims.

What is claimed is:

1. A method for detecting a step loss condition in a motor, comprising:
    determining a level of a first electromagnetic force signal; and
    comparing the level of the first electromagnetic force signal with a first reference signal at a first time.

2. The method of claim 1, wherein the first electromagnetic force signal is a first back electromagnetic force signal.

3. The method of claim 1, further including repositioning a stator field in response to the first electromagnetic force signal being less than the first reference signal.

4. The method of claim 3, wherein repositioning the stator field includes repositioning the stator field in a second direction for a stator field that was in a first direction before the first time.

5. The method of claim 1, further including:
    determining a level of a second electromagnetic force signal; and
    comparing the level of the second electromagnetic force signal with a second reference signal at a second time, the second reference signal having a signal level that is different from a signal level of the first reference signal.

6. The method of claim 5, further including determining the level of the second electromagnetic force signal after a predetermined amount of time.

7. The method of claim 1, further including:
    determining a level of a second electromagnetic force signal; and
    comparing the level of the second electromagnetic force signal with the reference signal at a second time.

8. The method of claim 7, further including repositioning a stator field in response to the first and second electromagnetic force signals being less than the first reference signal.

9. The method of claim 7, wherein the first and second times occur at consecutive zero crossings of a current flowing in an energy storage device.

10. The method of claim 1, wherein the first reference signal is one of a motor speed or a load angle.

\* \* \* \* \*